United States Patent [19]
Guenst, Jr. et al.

[11] 3,949,865
[45] Apr. 13, 1976

[54] PLATE CONVEYING APPARATUS
[75] Inventors: William C. Guenst, Jr.; Gerold Litschi, both of Ambler, Pa.
[73] Assignee: W. R. Grace & Co., New York, N.Y.
[22] Filed: May 2, 1975
[21] Appl. No.: 574,057

Related U.S. Application Data
[62] Division of Ser. No. 456,841, April 1, 1974, Pat. No. 3,926,297.

[52] U.S. Cl. ............... 198/131; 198/178; 214/1 BA; 269/54.1
[51] Int. Cl.² ......................................... B65G 17/12
[58] Field of Search ............ 198/19, 131, 178, 179, 198/180; 214/1 BA; 354/345, 346; 271/204, 209; 118/500, 502; 226/53; 269/54.1, 54.4, 54.5

[56] References Cited
UNITED STATES PATENTS

| | | |
|---|---|---|
| 1,358,515 | 11/1920 | Breth et al. .......................... 269/54.1 |
| 1,815,967 | 7/1931 | Caps .................................... 198/178 |
| 2,627,923 | 2/1953 | Duncan ............................. 226/53 X |
| 2,823,789 | 2/1958 | Henning .............................. 198/131 |
| 2,851,145 | 9/1958 | Gagnon ................................ 198/19 |
| 3,203,535 | 8/1965 | Elsas .................................... 198/180 |
| 3,279,148 | 10/1966 | Henn .............................. 198/131 X |
| 3,417,427 | 12/1968 | Kull ................................. 226/53 X |

Primary Examiner—Evon C. Blunk
Assistant Examiner—Richard K. Thomson
Attorney, Agent, or Firm—Charles L. Harness

[57] ABSTRACT

Plates, e.g. aluminum, are carried from one station to another in a plate treating apparatus by means of stabbing a pin into the plate at two points, thereby to brad the plate to at least two anvils. The anvils move on an endless chain from station to station, and the plate is released from the anvils at the final station.

1 Claim, 20 Drawing Figures

Fig. 19 ns an advancing anvil.

PLATE CONVEYING APPARATUS

This is a division, of application Ser. No. 456,841, filed Apr. 1, 1974, now U.S. Pat. No. 3,926,297.

The present invention is directed to a novel means for moving a metal or plastic plate from one station to another along a photocomposing assembly line, for example, to make a relief printing plate using a liquid photopolymer system. The means for carrying out this means of plate transport includes a plurality of "anvils" mounted on a chain. Each anvil carries a vertical shaft. The metal plate is brought over the top of the anvil, and is staked thereinto by a staking pin; thereafter the staked plate can be transported to consecutive stations farther down the assembly line to undergo various operations such as dispensing polymer thereon, exposure, development, and collection.

PLAN OF PHOTOCOMPOSING APPARATUS

Figure 1:
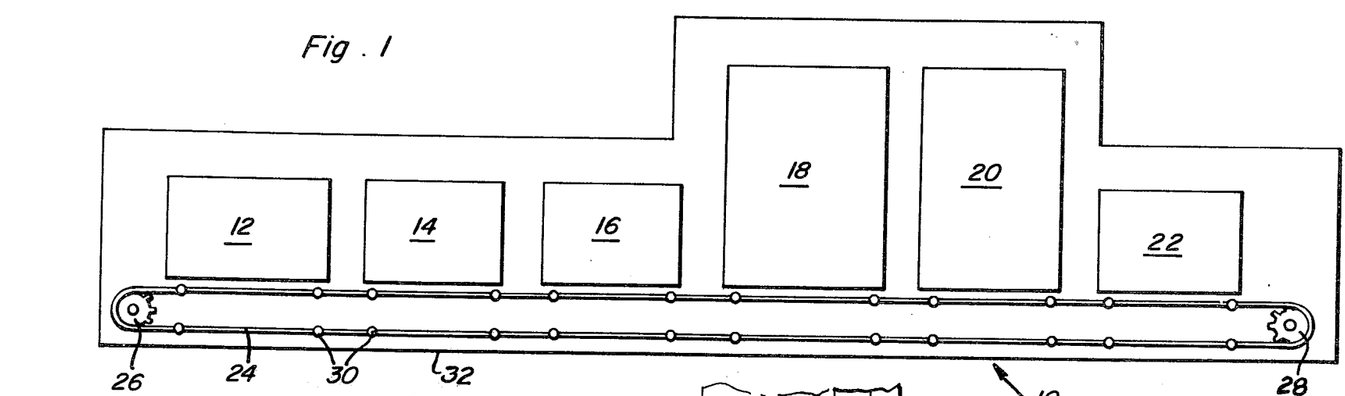
FIG. 1 shows a plan of the general layout of a photocomposing assembly line that can be used with the conveyance system of this invention.

Referring now to FIG. 1, at 10 is shown generally a letterpress photocomposing unit in schematic plan view. It will be noted that this apparatus comprises several operational units, all of which will be called herein "stations". At 12 is shown the first station, which is the plate stacking unit. At this station, metal or plastic plates are stacked up in storage, awaiting transfer, one by one, to the next station. The next station is shown at 14. This is the forming or dispense station. At this time the plate transferred from the stacker 12, is treated with a layer of liquid photopolymer. The photopolymer is spread out in a uniform layer by means of a doctor blade or the equivalent. The next is exposure station. The plate from the forming station 14 is transferred to exposure station 16. Here it is exposed to actinic radiation (i.e., UV radiation), through an image. After exposure the exposed plate is transferred to air knife station 18. Here an air knife moves across the plate from front to back, removing substantially all removable uncured liquid polymer, and leaving only a thin film on the plate surface. This operation leaves a relief printing plate. That plate is next transferred to blotting station 20, where residues of liquid photopolymer are removed from the relief surfaces by means of one or more rollers of blotting material, such as paper, Mylar, or the like. From this operation the plate is transferred to the final stage 22, at which the final operations occur. The first operation is a post exposure. This gives the plate its final cure. Other operations at this station 22 may include unstaking (i.e. removal of the plate from the anvils), and cutting.

The plate transfer mechanism is shown only diagrammatically in FIG. 1; viz., a continuous chain 24 moves around spur gears 26 and 28 and carries a plurality of anvils 30 onto which the plates are fastened or "staked" (by procedures below described).

STORAGE STATION

Figures 2, 3, 4, 5:
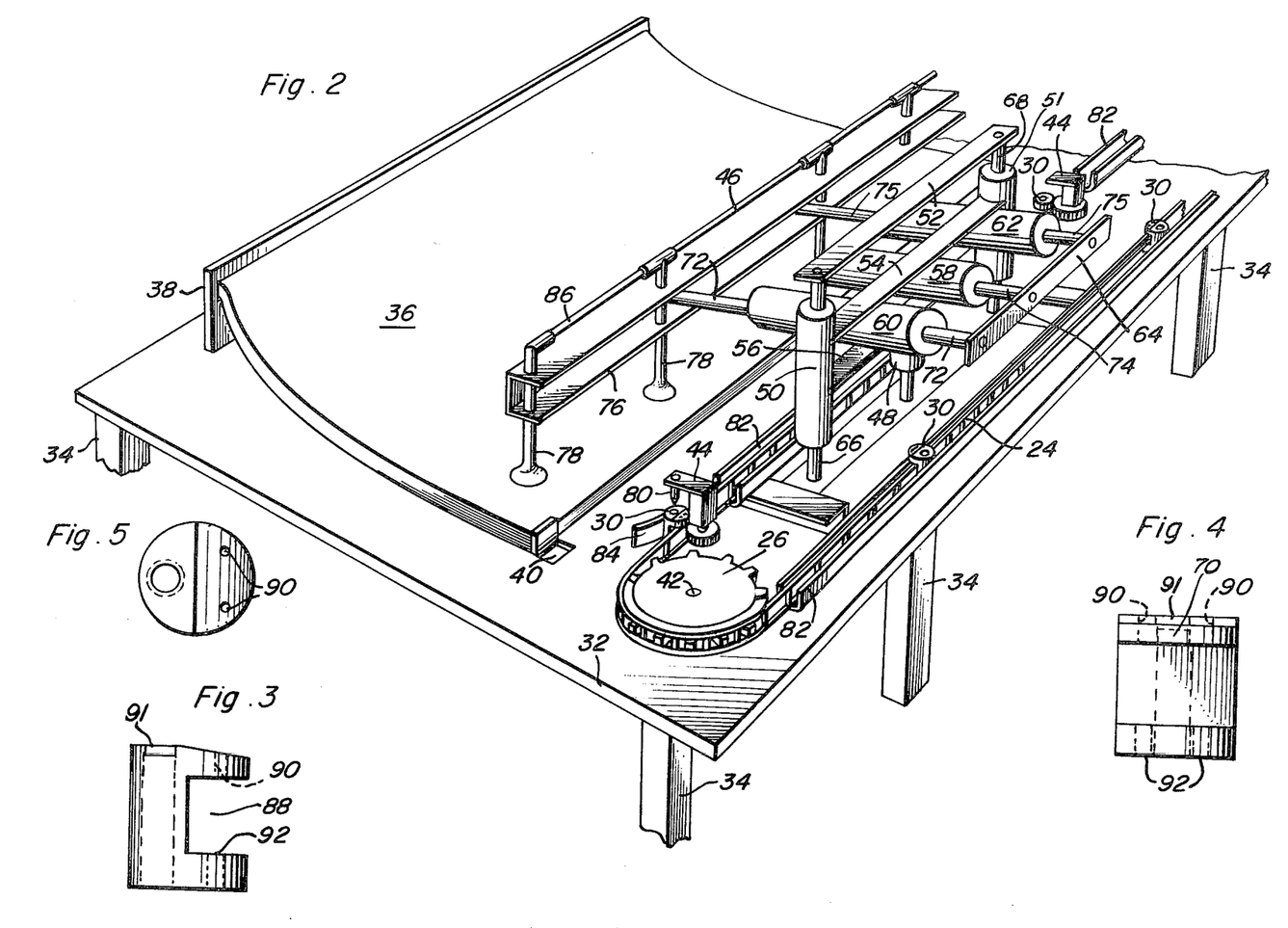
FIG. 2 shows the first station, i.e., the station where the plates are stored prior to being picked up and transported.
FIGS. 3, 4, and 5 show the details of the anvil used in the instant conveying system.

FIG. 2 shows the first station of the plate transfer mechanism. Table 32 is supported by legs 34. At 36 is shown a stack of plates in storage and ready to be picked up and transferred to the next station on the table. Preferably this stack of plates is somewhat elevated in the back in order to facilitate being picked up and pulled forward. This elevation can be provided by a permanently raised back area 38. The thus raised stack is prevented from flowing forward by stop 40. The front edge of the table 32 carries continuous link chain 24 which in turn carries plate staking anvils 30 at predetermined intervals along the chain. The chain-anvil assembly rides in channel guides 82. The chain is driven by spur 26 journaled on axle 42 connected to drive means (not shown) beneath the table 32. The staking mechanism is shown generally at 44. As shown in FIG. 2 there are two staking mechanisms per plate width; there could, however, be more. The plates at 36 are transferred by plate transfer mechanism shown generally at 46. This transfer mechanism comprises a vertical-operating cylinder 48 together with guides 50. Guides 50 are connected together by cross bars 52, 54 and 56. Cross bars 54 and 56 are welded to guide bushings 50 and 51. Air cylinder 48 is welded to the bottom of cross bar 56. The horizontal means for moving the plate transfer mechanism 46 comprises air cylinder 58 together with guide bushings 60 and 62. All three cylinders 58, 60, and 62 are welded to cross bars 54 and 56 at their respective points of contact. Additionally the guide stems of cylinders 58, 60 and 62 are respectively fixed to cross bar 64. The guide stem of bushings 50 and 51 are shown at 66 and 68; of air cylinder 48 at 70; of guide bushing 60 at 72; of air cylinder 58 at 74; and of guide bushing 62 at 75. The farther extensions of guide shafts 72 and 75 are fixed to channel bar 76. Inserted in channel bar 76 are a plurality of suction cups 78. These pass through channel bar 76 and are interconnected by vacuum line 86 which leads to a vacuum source (not shown).

The apparatus shown in FIG. 2 operates as follows: Air under pressure (from a source of compressed air, not shown) enters air cylinder 48. This drives the entire assembly down so that the rubber cups 78 come into full contact with the topmost sheet material. The vacuum source then turns on, pulling a vacuum on each of the vacuum cups 78. By this action the sheet is adhered to the vacuum cups. The air cylinder 48 now reverses and raises the lifting mechanism 46 slightly, and in a plane with the top surfaces of anvils 30. (In a preferred embodiment the plate may be moved backward by air cylinder 58 about ⅛ inch in a "hitching action" to facilitate clearance of the stop 40.) Next air cylinder 58 is activated by a source of compressed air (not shown) and the vacuum cup arm 76 is drawn toward the plate staking mechanism (30/44), and the sheet is brought on top of the anvil 30 and under the staking pin 80 of the staking mechanism 44. With the vacuum still on, the staking mechanism is activated. The staking pin 80 plunges down and affixes the metal plate into the holes of the respective anvils 30. The staking pin 80 then rises, the vacuum is released, the air cylinder 48 is activated to raise the vacuum bar 76 slightly, then air cylinder 58 is activated to push vacuum bar 76 forward over the stack of plates once more. While the latter is occuring, the driving mechanism for chain 24 has been activated, and the staked plate is being moved to the next station 14 on the table 32. (See FIG. 1.) When it reaches the next station the drive mechanism for chain 24 automatically stops, and the advance is such that the length to the next station is exactly sufficient to bring a new set of anvils around and under their respective staking mechanisms 44. Following this the cycle is repeated.

The chain 24 rides in U-channels 82, with which may be associated additional guides as shown at 84.

Aluminum plates are preferred with the apparatus of this invention. Such plates are nominally 37½ inches by 28 inches in size, by 10 mils thick. They give a particularly good bradding and fastening action with the anvils, and yet are readily released therefrom. Other useful plates include steel and plastic (e.g., Mylar).

THE PLATE STAKER

The plate staker anvil 30 is shown in side elevation in FIG. 3, front elevation in FIG. 4, and top view in FIG. 5. It will be noted that this anvil contains an indentation 88 for affixation of the sprocket chain through holes 90, 92 in the upper and lower positions of the anvil. A shaft 70 runs through the base of the anvil from top to bottom at the back. This shaft has a slight constriction 91 at the top.

Figure 6:
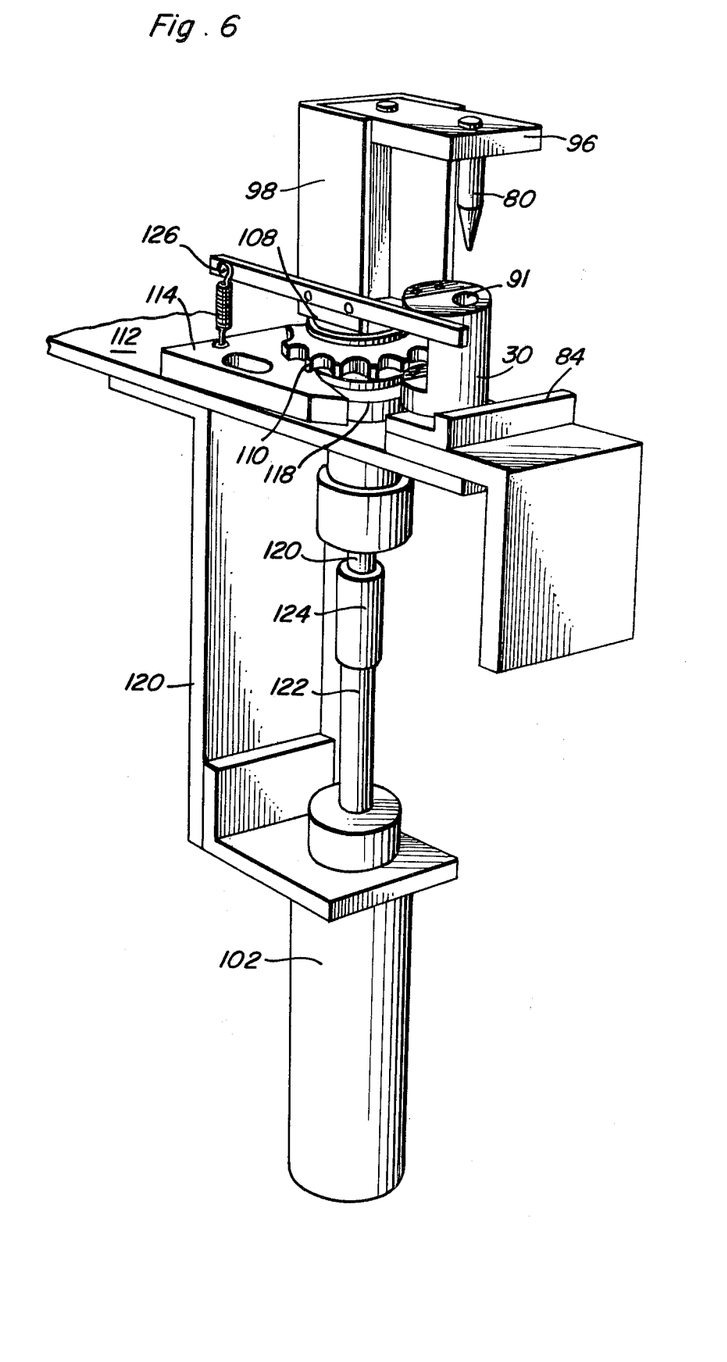
FIG. 6 is a perspective view of the staker assembly.

The mechanism for attaching the plates to the continuously moving chain 24 (actually to the anvils 30 on the chain), and the eventual remc 1 therefrom is a most important aspect of this invention. The means for fastening the plates to the anvils 30 is the plate staker assembly 44, or simply, the plate staker. This is shown in detail in FIGS. 6 and 7. Referring to FIG. 6 the staking pin is shown at 80. The base of this pin is fixed in staker pin holder 96. Staker pin holder 96 slides up and down in channel guide 98. This motion is caused by motion of shaft 100 (see FIG. 7), as actuated by air cylinder 102. Shaft 100 moves in cylindrical lubricated washer (of the "oilite" type) 104. (See FIG. 7.) Cylindrical washer 104 fits in stationary sleeve 106 (see FIG. 7). Rotating around sleeve 106 is another cylindrical lubricated washer 108, and around this washer rotates sprocket 110. Sprocket 110 carries sprocket chain (not shown). The staker assembly is mounted on platform 112, which carries adjusting guide 114 to give a close fit around sleeve 118, the latter carrying the lubricated washer 104 and the sleeve 106. Sleeve 118 is fixed within platform 112. Platform 112 carries also bracket 120 which holds air cylinder 102. Air cylinder 102 carries piston rod 122 which is suitably attached to rod 100 through collar 124.

Figure 7:
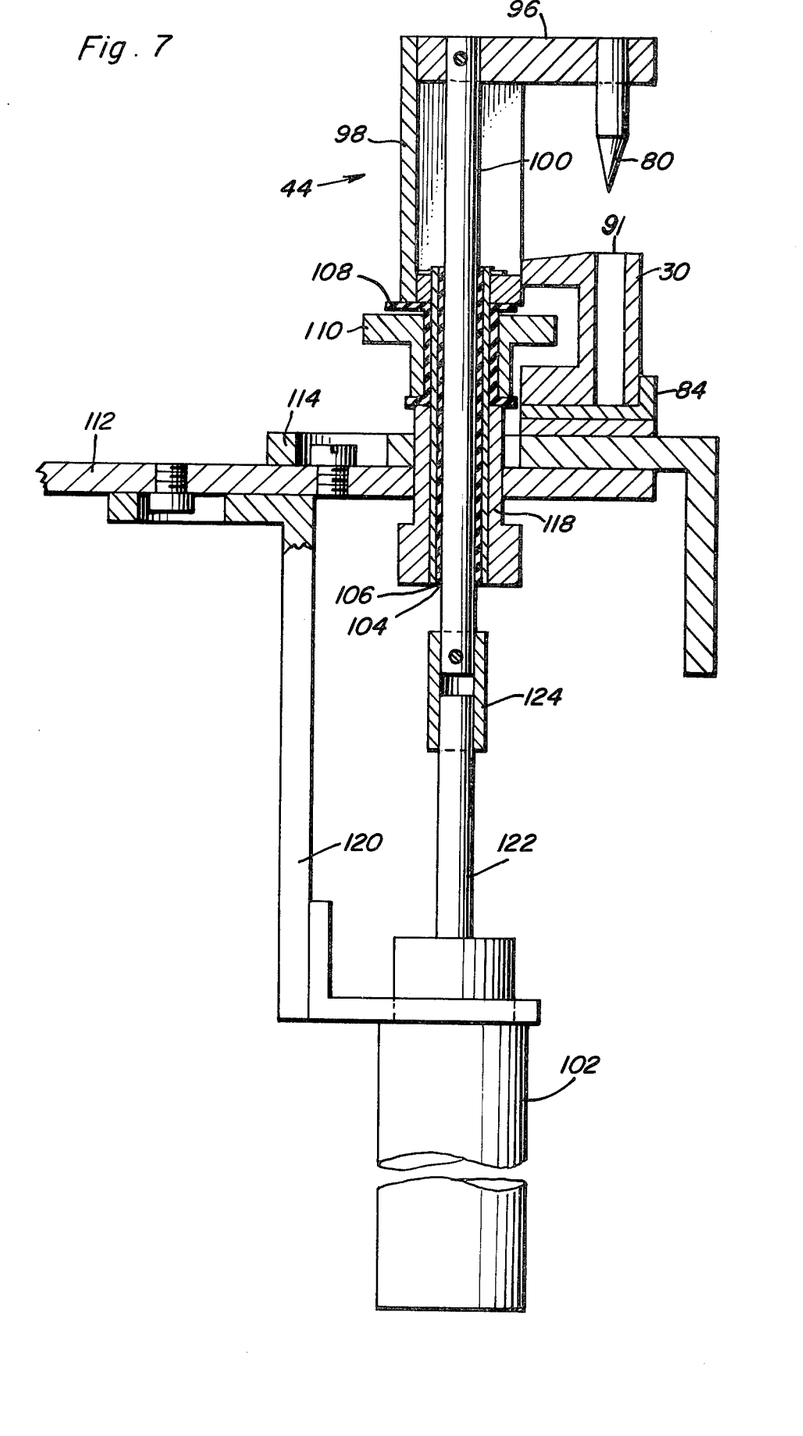
FIG. 7 is a sectional view of the staker assembly of FIG. 6.

Anvil 30 is shown in mating relationship with staking mechanism 44, but the chain 24 is not shown. The guide 84 is shown in section, and it will be noted that at this area it is the U-channel guide 82 minus the inner leg of the U.

Bar 124 aids in aligning pin 80 with anvil hole 91, as will be explained in connection with FIG. 8.

Figure 8:
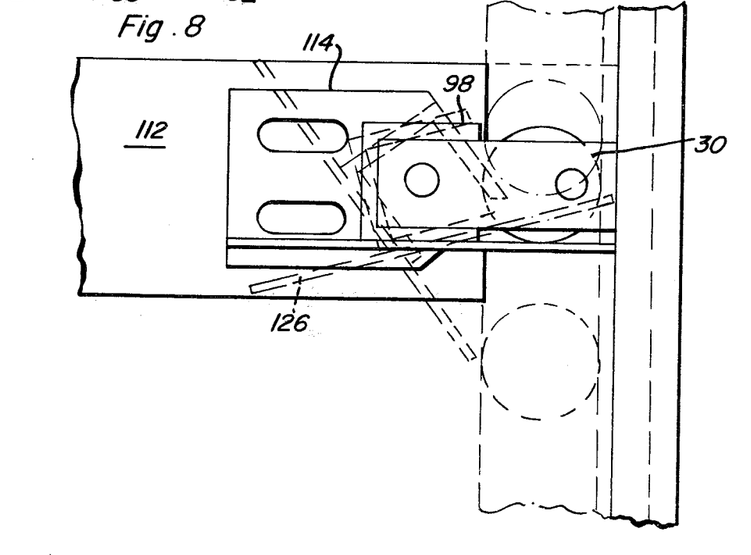
FIG. 8 is a plan view of the staker showing its swiveling mode, whereby it is first aligned, then pushed aside by an advancing anvil.

Referring now to FIG. 8, it is noted that this is a plan view of the staking mechanism 10. In particular FIG. 8 shows the swiveling interaction of the staking mechanism with the anvil. At the beginning of the sequence, the anvil 30 is moved into contact with horizontal contact arm 126, the latter being slightly biased counterclockwise. When the chain 24 stops it will leave the contact arm 126 approximately perpendicular to chain 24. Since the contact arm has been regulated to present a predetermined registry of the staker 80 with the anvil hole 91, the bradding action can be undertaken whether or not an exact perpendicular relationship of staker and anvil is obtained. After the staking operation is completed the contact arm 126 (and, of course, the channel guide 98) are further swiveled in a clockwise direction as the anvil begins to move again and pass on. After the anvil passes on, the channel guide 98 with its contact arm 126 swings back to its slightly askew position, awaiting contact with the next anvil.

This staker is particularly effective with aluminum plates. When the staker pin 80 plunges into the plate, the plate bursts, and several triangles of metal fold back under the constriction 91, thereby bradding the plate to the anvil 30. This bradded position is shown in section in FIG. 16.

Apparatus associated with the polymer dispense station (see 14, FIG. 1) and the exposure station (see 16, FIG. 1) is not shown in detail. The mechanisms used are well known in the art and are well described for example, in U.S. Pat. No. 3,635,711. At the dispense station, after dispensing the photopolymer, it is spread and leveled on the plate backing, preferably by means of a doctor blade mechanism such as that shown in U.S. Pat. No. 3,782,327 of Jan. 1, 1974. An alternate exposure unit equally suitable is described in U.S. Pat. No. 3,597,080.

Figure 9:
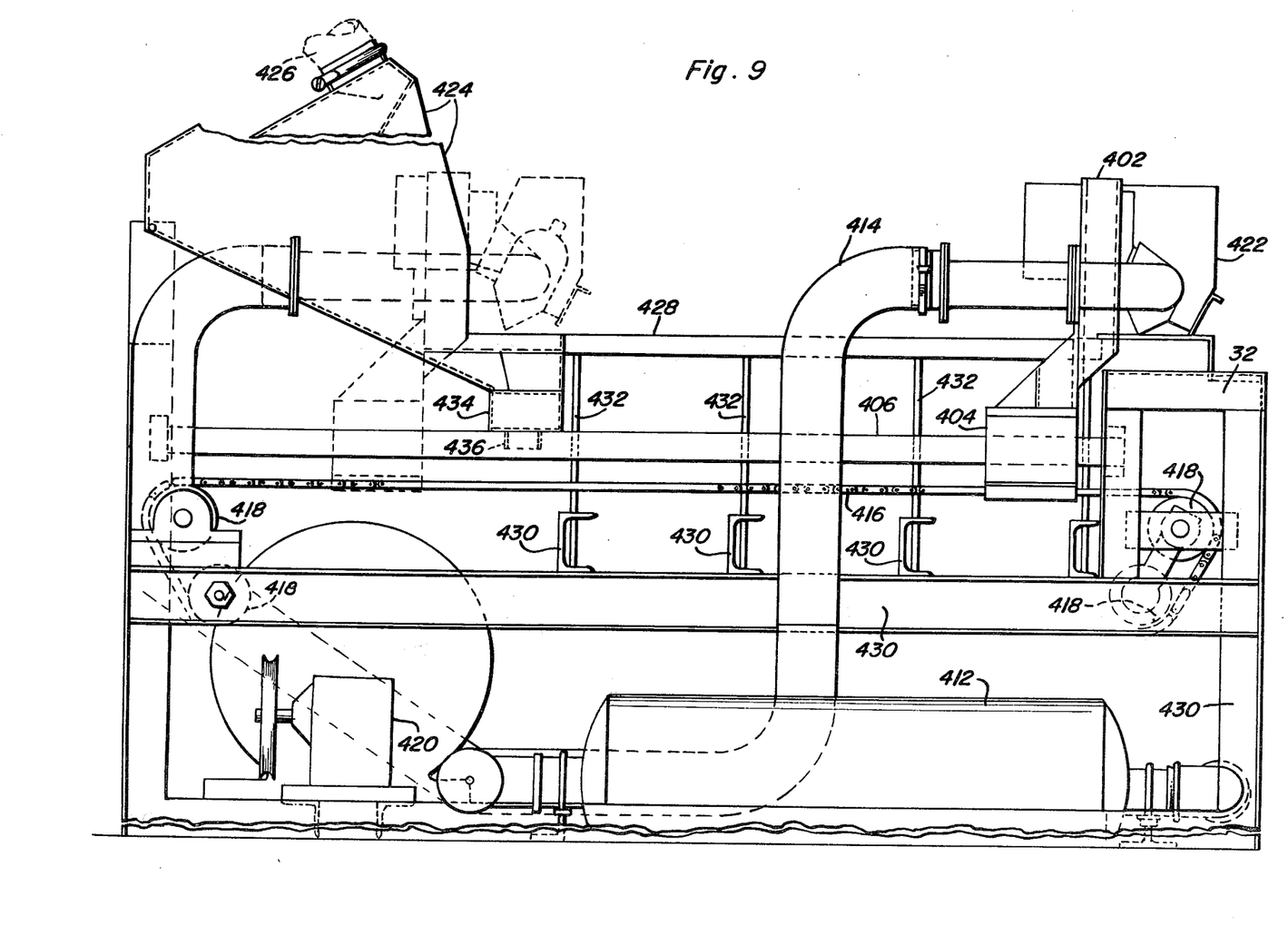
FIGS. 9 and 10 show side and front elevations respectively of an "air knife" means for developing a relief printing plate.
Figure 10:
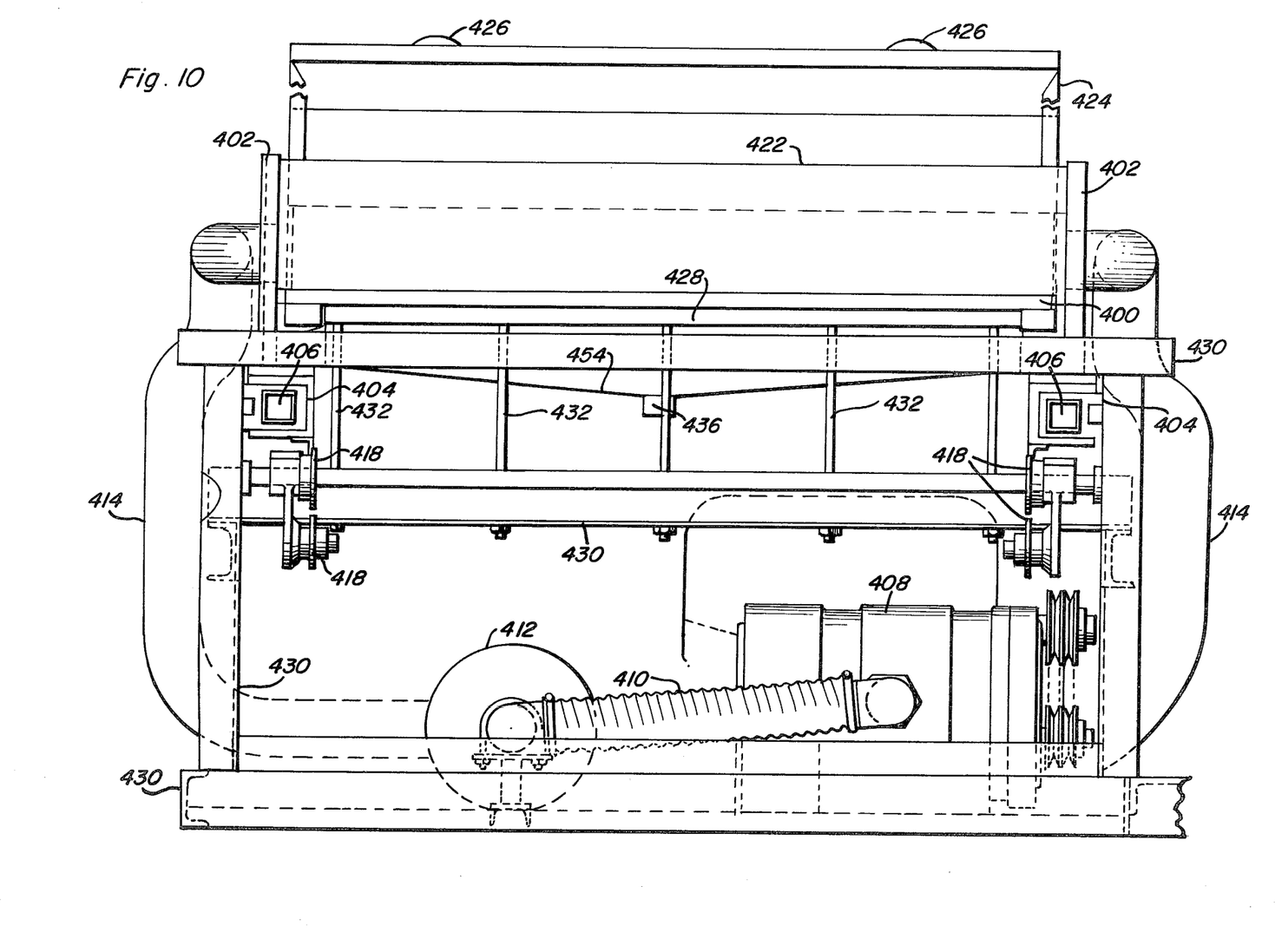

Referring now to FIG. 9, the air knife is shown generally at 400. The term "air knife" refers to a device providing a thin sheet of air under pressure directed to the exposed plate, for the purpose of blowing away uncured polymer, thereby leaving cured polymer is relief on the plate. At 402 is shown a frame constituting the air knife holder. At 404 is the air knife holder bearing, which is adapted to slide on rail 406. An air compressor is shown at 408, and leading therefrom is air conduit 410 (see FIG. 10). Conduit 410 leads to a muffler 412 to which are connected air knife ducts 414. Air knife holder bearing 404 is driven by chain 416, which is linked over pulleys 416, driven by chain drive motor 420.

Spray deflector 422 is positioned over the air knife 400 to prevent spray from being blown on the operator.

In its completed operational position, as shown in the dotted lines, air knife 400 plus spray deflector 422 closely approach hood 424, which further minimizes spray. At 426 is shown a duct for hood 424.

At 428 is shown the platen on which rests the plate assembly. At 430 are shown various framing members, and at 432 various platen supports. Waste polymer collection sump is shown at 434, and this drains into drain 436.

In its starting position the air knife assembly is at the rear of the air knife station 18. This permits the plate to be brought across to the platen 428 from station 16. Chain drive 416 is now activated and moves the air knife assembly forward to the limit of its forward run. While the plate is still being held by the stake and anvil assembly, the air knife 400 is activated via air compressor 408 and chain 416, to begin its passage to the rear of the air knife station 18. During this passage the sheet of air forces liquid uncured polymer off the plate and to the rear of the station, where it drains into sump 434 and drain 436. After the air knife 400 reaches the end of its journey toward the rear of station 18, it stays there until the next plate is pulled across to platen 428, after which the cycle is repeated. After each such operation, the developed (i.e., air blown) plate is automatically passed to the next station, at 20, where it will be blotted.

THE BLOTTER

Figure 11:
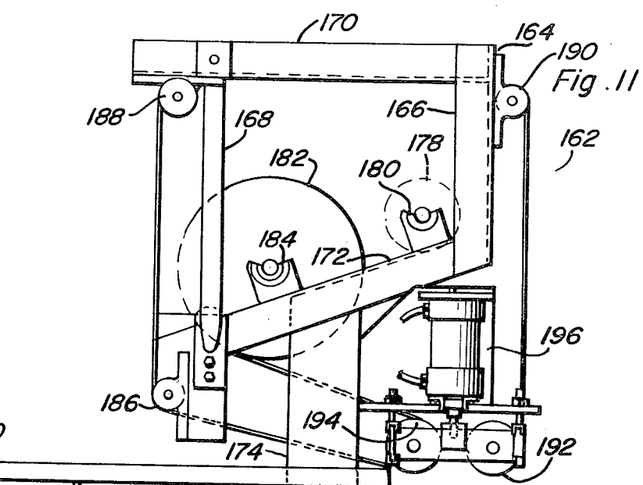
FIGS. 11 and 12 show a side and front elevation of blotting means for removing residual liquid polymer from a printing plate which has been air-knifed.

Referring now to FIG. 11, the general platform carrying the chain conveyor and anvil system is shown at 32. This is affixed into a framework designated generally at 130, and comprising bottom supports 132 and 133, upper support 134, and front supports 136, 137, 138, and 139; back support 140, guide bars 142 and 143, cross supports 144, 146, 148, and 150; vertical platform supports 152, 154, 156, and 158. The blotter platform is shown at 160.

The blotter assembly generally is shown at 162. This assembly comprises blotter frame 164, front frames 166 and 167. Back frame 168, upper frame 170, lower frame 172, blotter assembly support 174, and support channels 176 and 177. The blotting paper feedroll is shown at 178, resting in its feed roll open bearing 180. The takeup roll is shown at 182, resting in its takeup roll bearing 184. Blotting paper idler rolls are shown at 186, 188, and 190. The front pressure roll is shown at 192 and the back pressure roll at 194.

The pressure roll lift assemblies are shown generally at 196 and 197. See FIG. 11. The assembly is supported by support bracket 198, which carries upper support plate 200, air cylinder 202. The latter carries air cylinder piston 204. At 206 and 208 are shown lower stops, and at 210 and 212 the upper stops. MOtion block 214 carries journals 232 and 234. Piston connector 216 connects motion block 214 to air cylinder piston 204. Air cylinder 202 carries air hoses 218 and 220 connected to an air source, not shown. Cylinder retaining bolt 222 connects the bottom of the air cylinder 202 to the plate 200.

An endless chain 250 is connected to support channel 176. The chain is carried on sprocket gears. The chain is connected to drive means (e.g., a motor) 262 via forward/reverse means not shown.

Figure 12:
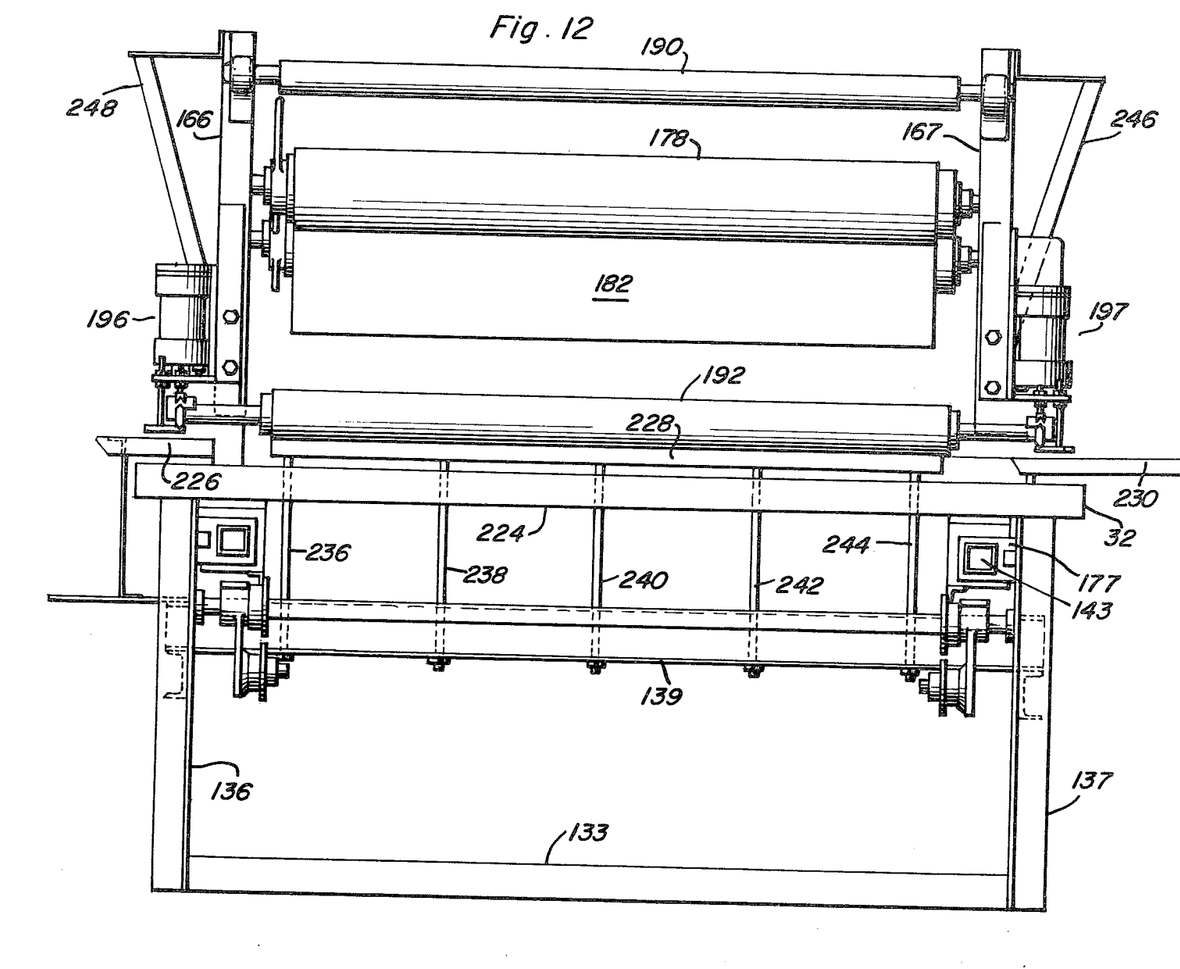
Figure 13:
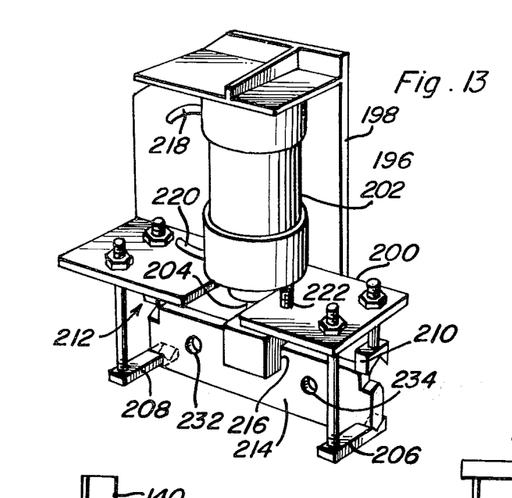
FIG. 13 shows a perspective detail of the lift mechanism for the blotting roll assembly.

Referring to FIG. 12, front support member is shown at 244, platform bases at 226, 228, and 230.

Vertical supports connecting frame member 139 and blotter platform 160 are shown at 236, 238, 240, 242, and 244. Side stabilizers are shown at 246 and 248.

From a consideration of its structure the operation of the blotting mechanism will be fairly obvious. However, the following explanation may be made. In the "storage" position, the assembly 162 is in the rear position (see FIG. 9) and the pressure rolls 192 and 194 are raised. The plate is passed over from the air knife section and onto the platform 160. This plate carries small residues of liquid photopolymer, and most of these residues will be removed in the blotting operation. The chain 250 is now activated, and the blotting assembly comes forward and stops at its forward limit position. Air is now released into the air cylinder 202 by air line 218. The air cylinder piston 204 comes down, bringing with it gap motion block 214, which, of course, brings down the pressure rolls 192 and 194. Motor 282 is now activated and this in turn activates chain 250, which draws support channel 176 to the rear. Drive means not shown drives takeup roll 182 during this operation. The motion of blotter assembly 162 continues until it makes a complete pass over the relief printing plate resting on blotter platform 160. Then the action is reversed. Air is released from air cylinder 202, which action raises air piston 204 carrying with it gap motion block 214. This raises pressure rolls 192 and 194. This leaves the assembly in its storage position, ready to repeat the cycle when the next plate comes over. The blotting relief printing plate is then moved by the chain conveyor system to the next and final station, No. 22 (see FIG. 1) for post exposure and recovery.

POST EXPOSURE, ETC.

Figure 14:
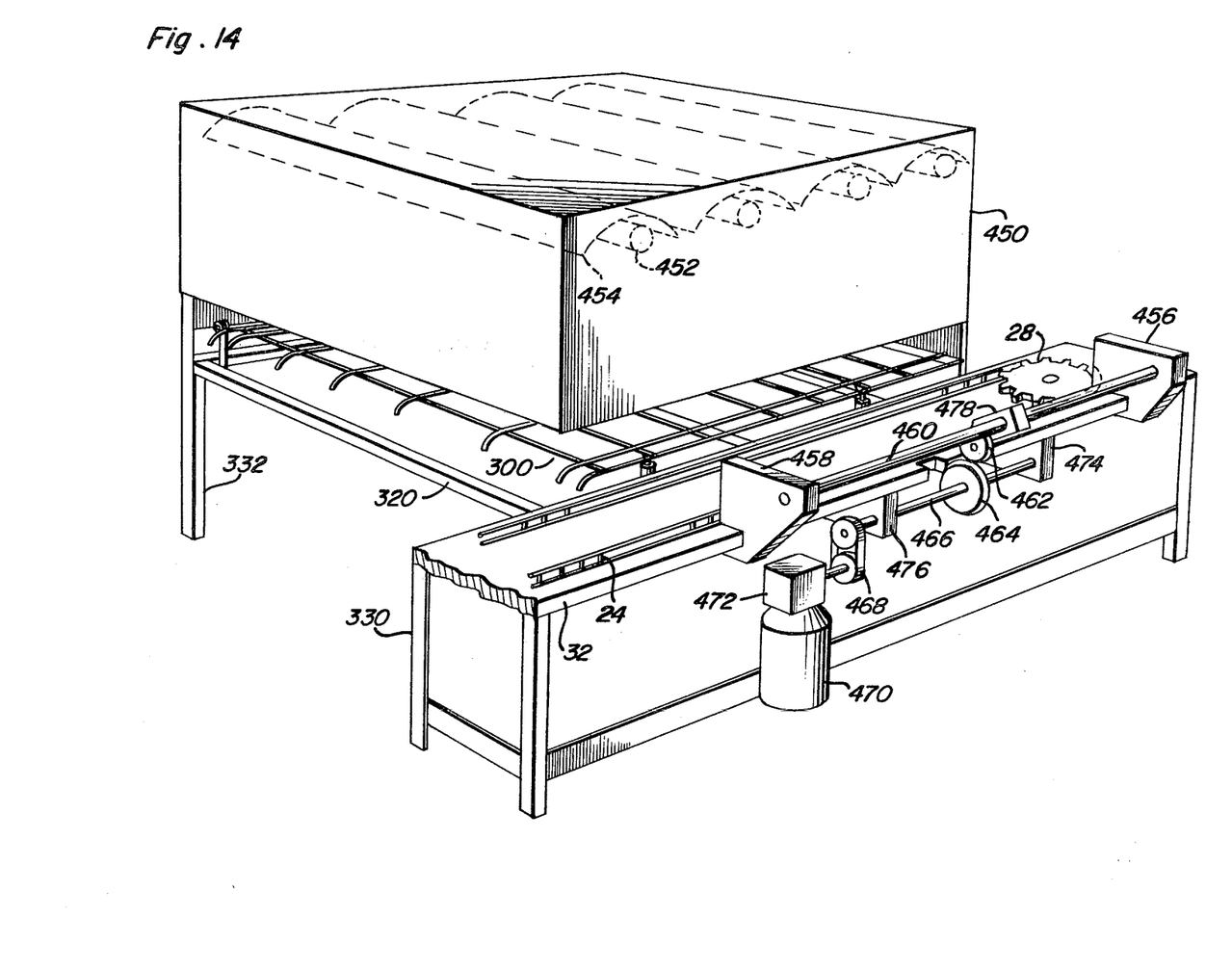
FIG. 14 shows a perspective, the post exposure station plus an optional front cutter useful in the herein described photocomposing assembly.
Figure 15:
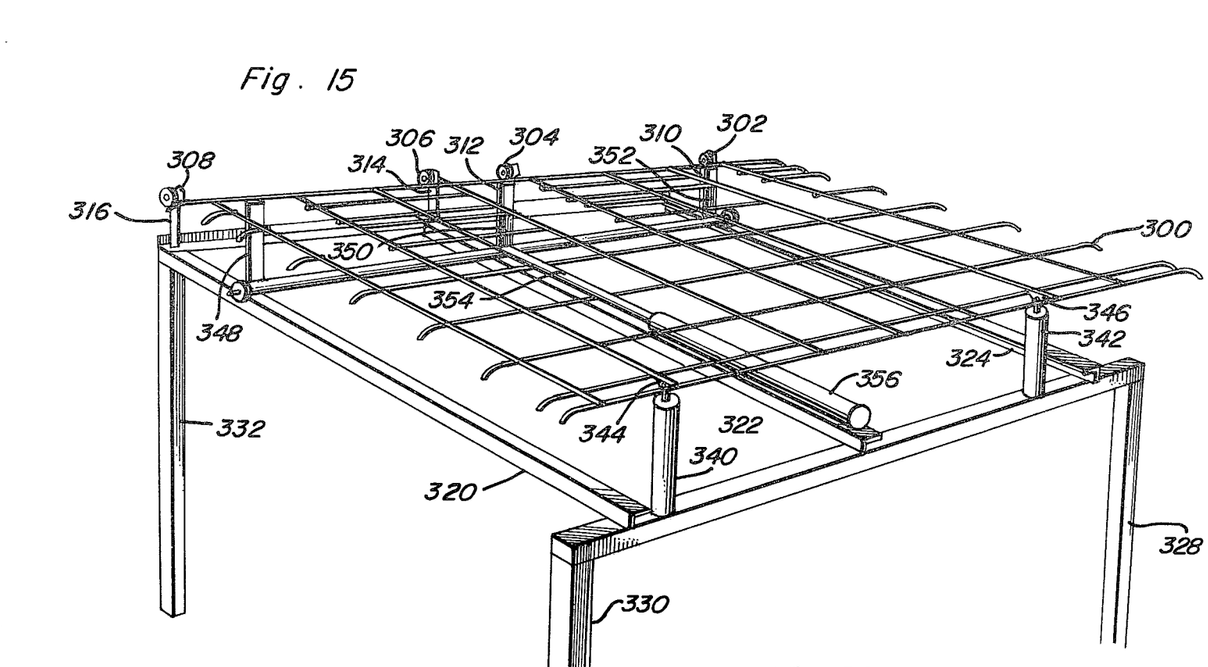
FIG. 15 shows the grid support plus removal means of the post exposure station, whereby the finished printing plate is snapped from the anvils.
Figure 16:
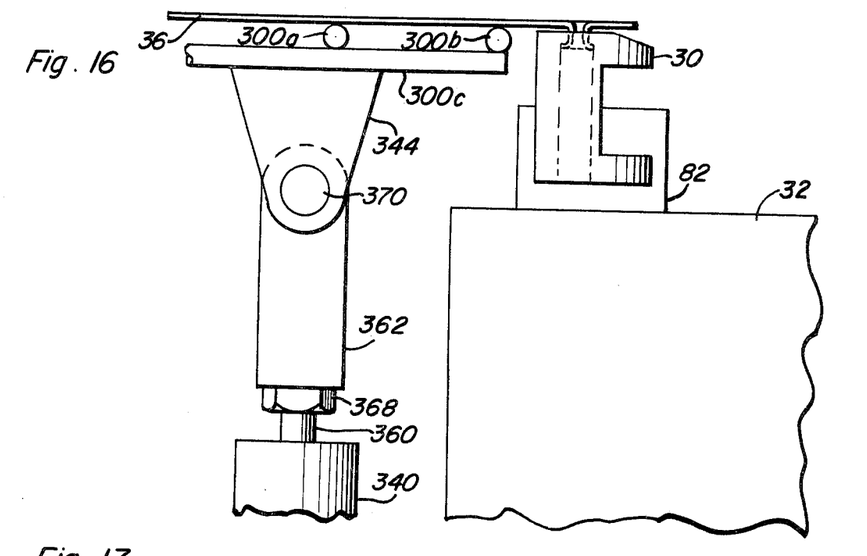
FIG. 16 shows a detail of plate removal from the anvil.

Referring now to FIG. 14, this shows the post exposure station, and represents the final operational unit in the sequence of operations comprising the integrated photocomposing apparatus using this invention. The post exposure station is housed in housing 450. This housing contains a plurality of ultraviolet lamps shown typically at 452. These lamps are housed in reflectors 454. On the operator's side of the unit is positioned (optionally) cutting means. This is used in the typical situation in which the relief printing plate is a double size newspaper plate and is to be slit down the middle prior to use. Means for removing the plate from the supporting anvils are now shown in FIG. 14, but are shown in FIGS. 15 and 16. Following removal, the plate (if it is to be slit) is advanced until the leading edge is caught between an upper cutting wheel 462 and a lower cutting wheel 464. The motion of these cutting wheels suffices to pull the plate through the cutting means, and the two resulting plates can then drop into receiving bins (not shown). Upper cutting wheel 462 is fastened to the extremity of upper cutting wheel holder 478, which pivots on shaft 460. Shaft 460 is journaled in bearing blocks 456 and 458. The cutting mechanism is driven by motor 470 which operates through gear reducer 472, which drives a pulley system 468, which in turn drives shaft 446 on which is mounted lower cutting wheel 464. Shaft 466 is carried by shaft blocks 474 and 476.

PLATE RELEASE

FIG. 15 shows the plate release mechanism. A plate support grid 300 is hinged at its rear by hinges 302, 304, 306 and 308. The latter series of hinges are carried by respective supports 310, 312, 314, and 316 affixed to framing bar 318. Other framing elements are 320, 322, and 324, running from front to back and a cross framing bar 326 carries the three letter bars. All framing elements are welded or bolted together. The framing elements are carried by support members or legs 328, 330, and 332. The rear and farthest leg is not shown. The grid 100 carries a plurality of slots, 334, 336, and 338, for about half its depth. To the forward position of the grid, preferably at a plurality of grid intersections, are positioned air cylinders 340 and 342, affixed respectively to shaft supports 344 and 346, fastened to intersections of the grid. A "rake" with three tines respectively 348, 350 and 352, and with shaft 354, is operably actuated by air cylinders 156. Air cylinders 340 and 342 rest on bracket 358 affixed at either edge to framing elements 320 and 324. Air cylinder 356 is affixed to cross bar 322.

This plate releases mechanism as shown generally in this FIG. 15, operates as follows:

Assuming that the plate is in a stationary position on the grid (the drive chain 24 having stopped, whether or not for some treatment operation while the plate is on the grid), air cylinders 340 and 342 are activated via elements 344 and 346 affixed to the grid 300, thereby to hinge the grid upward for about one linear inch. This action is very brisk and has the effect of springing the plate loose from the anvils to which it is staked. The air cylinders are then deactivated and the front part of the grid drops level. Then air cylinder 356 is activated so that the plate moves toward the front of the apparatus. The three tines 348, 350, and 352 push the free plate forward. The tines move through the slots 334, 336, and 338 until the plate falls into a collecting bin in front of the plate release station. If desired a slitting means (e.g., as described in FIG. 14) can be located just in front of the plate release grid, and this slitting means can take the plate from the tines and move it still forward while simultaneously completing the slitting operation. These two pieces would then drop in the waiting bin. Following the plate release the chain drive is again activated and the plate from the station to the left is carried on to the plate release grid and the sequence of steps is repeated.

FIG. 16 shows the plate release mechanism in more detail. As noted in this figure the plate 36 is bradded into the anvil 30. The grid work on which the plate rests is identified as 300a, 300b, and 300c. To this grid work is affixed a bracket 344. Air cylinder 340 has piston shaft 360 fastened by a hex nut 368 to bracket swivel member 362 through journal 370. The general table is shown at 32. Anvil 30 rides in a U-shaped channel 82 shown in section in this figure. In this figure the chain drive mechanism including the anvils lies on the right of the observer, and the grid on the left.

DRIVE ASSEMBLY

Figure 17:
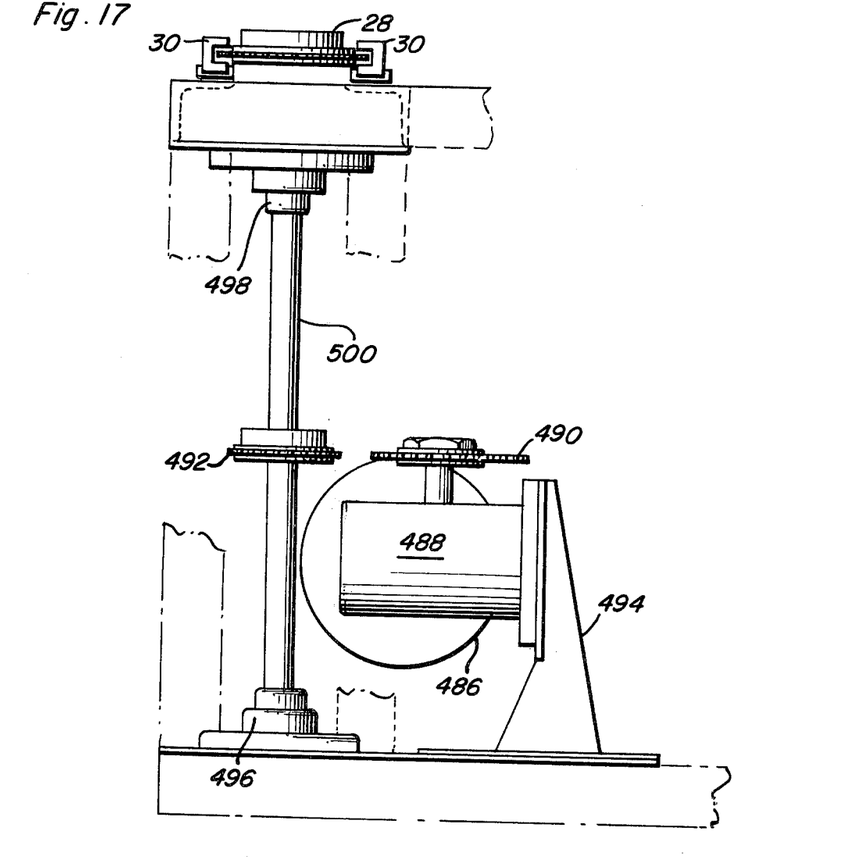
FIG. 17 shows a side elevation with parts cut away of the drive means for the conveying mechanism.
Figure 18:
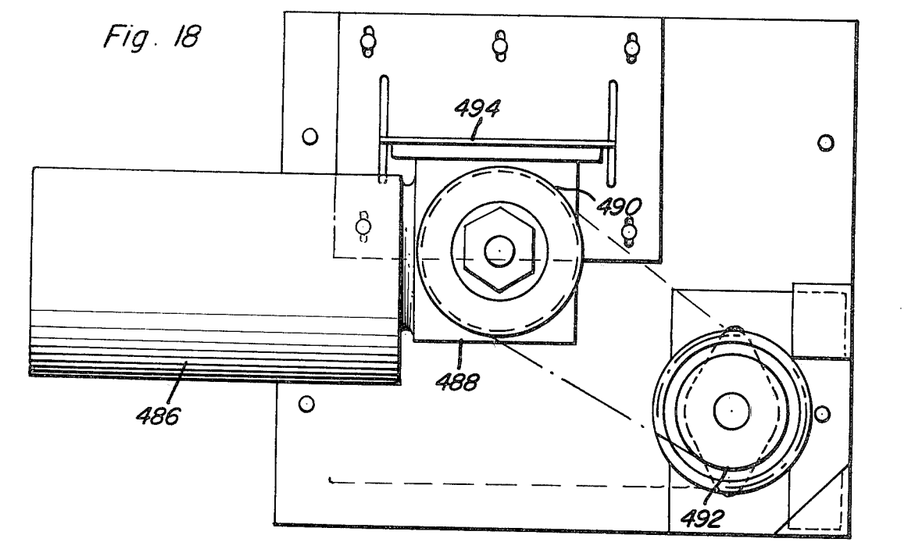
FIG. 18 shows a plan view of the bottom area of the aforesaid drive mechanism.
Figure 19:
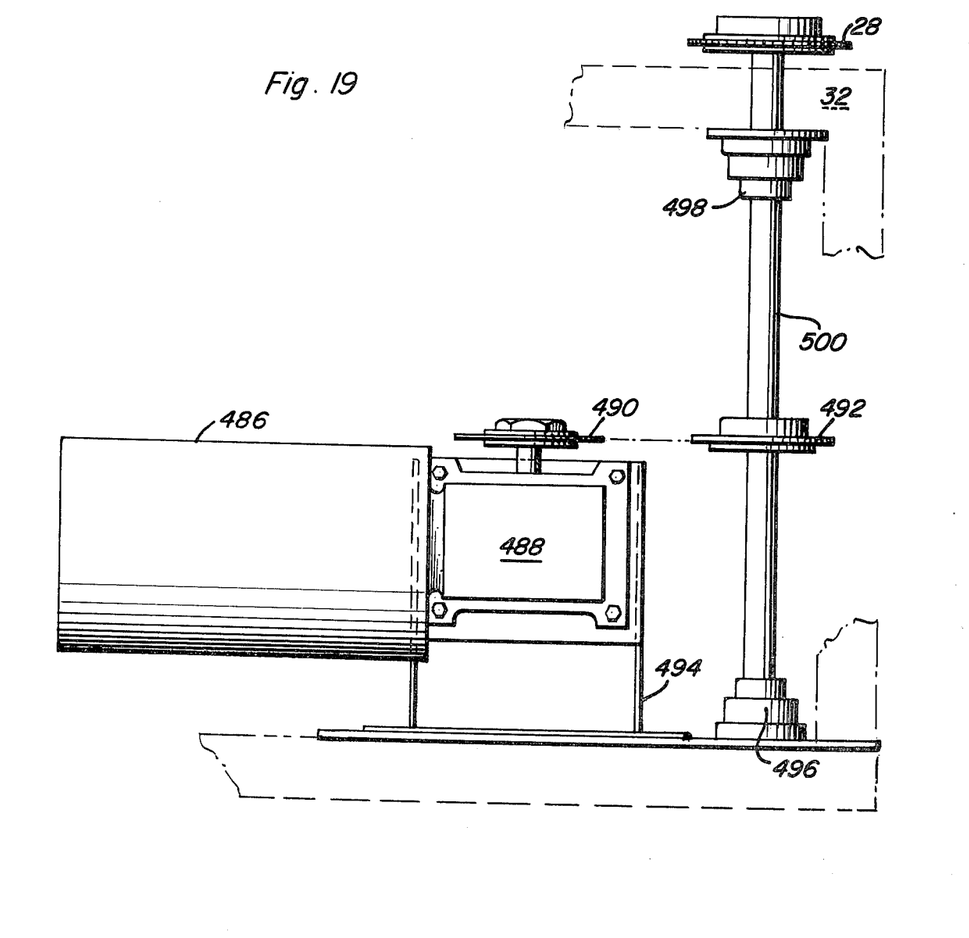
FIG. 19 shows a front view of the same drive mechanism.
Figure 20:
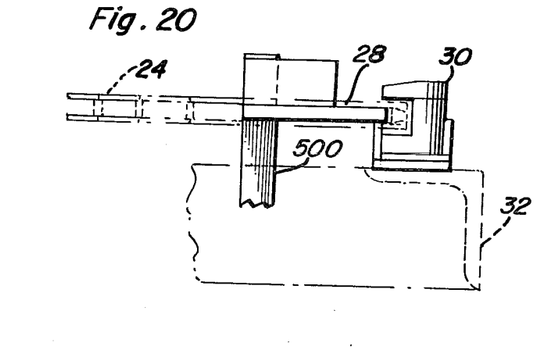
FIG. 20 shows a detail of the spur gear which drives the chain conveying mechanism.

FIG. 17 shows the general drive assembly for the anvil and chain mechanism. Many of the same parts are shown in different views also in FIGS. 18, 19, and 20. Spur gear 28, which drives the chain 25 is itself driven by shaft 500, which is housed in lower bearing 496 and upper bearing 498. An electric motor 486 is connected to a gear reducer 488 carried by drive assembly support 494. The gear reducer 488 connects to spur gear 490 which drives an associated spur gear 492 mounted in the same plane on drive shaft 500.

For automatic operation it has been found suitable to connect motor 486 to a relay system. This relay system, which is not shown, is continually closed except when two anvils pass a photoelectric cell. When this occurs the relay opens and the motor 488 shuts off. This is a convenient means of causing the sequence of printing plates to stop at each of the stations on the photocomposing assembly line above described. The motor means 488 can, of course, also be operated by a manual switch.

Various modifications in this plate conveying mechanism can be made without departing from the scope of the invention. For example, instead of sliding in a channel, the anvil may move on one or more rails. In the latter case the anvil will, of course, carry appropriate guide slots. In this connection a monorail system with one slot in the anvils is eminently suitable.

The anvil-chain system can be stopped and started by various means. As described herein, photoelectric relays were used. However, good results have been obtained with mechanical switches. When switches are used, it is convenient to use two switches side by side. The oncoming anvil strikes one switch thereby signalling to the drive motor to slow down to a crawl. The anvil then hits the second switch, and this stops the assembly instantly. When using this embodiment, the plate staking assembly with an aligning wand (see element 126 in FIG. 6) may be simplified considerably. Using two mechanical switches we have been able to stop the drive assembly instantly, achieving very good alignment without causing the staking assembly to swivel. In this connection swiveling means can be completely eliminated and the staking pin will stay in one vertical position, achieving automatic alignment with the crimping hole 91 of the anvil.

These are only a few of the equivalents possible within the spirit and scope of this invention and others will be obvious to those skilled in the art.

It will be obvious that the plate conveying mechanism herein described can be used with apparatus other than photocomposing apparatus.

What is claimed is:
1. Plate conveying apparatus comprising:
   1. a platform;
   2. an endless chain driven on the platform;
   3. a plurality of anvils on the chain, each anvil having a vertical shaft with a constricted neck;
   4. means to pull a plate over the top of at least two anvils;
   5. staker means to drive a staking pin down into the anvil shaft and to bring it up again; and
   6. stop-start means, the chain drive having means automatically (a) to stop when a plurality of anvils are in staking positions opposite a plate-holding station, and (b) to start again after the staking pin is pulled up from the anvil shaft;
   the said apparatus having means to pick up a plate at a plate storage station and to convey the plate successively to several stations in a photocomposing assembly.

* * * * *